(12) United States Patent
Kim et al.

(10) Patent No.: US 12,132,119 B2
(45) Date of Patent: Oct. 29, 2024

(54) SEMICONDUCTOR DEVICES

(71) Applicant: SAMSUNG ELECTRONICS CO., LTD., Suwon-si (KR)

(72) Inventors: Kihwan Kim, Seoul (KR); Sunguk Jang, Hwaseong-si (KR); Sujin Jung, Hwaseong-si (KR); Youngdae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 541 days.

(21) Appl. No.: 17/489,181

(22) Filed: Sep. 29, 2021

(65) Prior Publication Data

US 2022/0216348 A1 Jul. 7, 2022

(30) Foreign Application Priority Data

Jan. 6, 2021 (KR) .................. 10-2021-0001407

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02532* (2013.01); *H01L 21/02576* (2013.01);
(Continued)

(58) Field of Classification Search
CPC ......... H01L 29/78696; H01L 21/02532; H01L 21/02576; H01L 21/02579; H01L 21/0259; H01L 29/0665; H01L 29/16; H01L 29/42392; H01L 29/66545; H01L 29/66553; H01L 29/66742; H01L 29/78618; H01L 29/161; H01L 29/36; H01L 29/0673; H01L 29/41766; H01L 29/66439; H01L 29/42376; H01L 29/785; H01L 29/1041; H01L 29/0847

See application file for complete search history.

(56) References Cited

U.S. PATENT DOCUMENTS 10,177,227 B1  1/2019  Yoshida et al.
2013/0071980 A1  3/2013  Lin et al.
(Continued)

*Primary Examiner* — Davienne N Monbleau
*Assistant Examiner* — Sesha Sairaman Srinivasan
(74) *Attorney, Agent, or Firm* — F. Chau & Associates, LLC

(57) ABSTRACT

A semiconductor device includes an active region extending in a first direction on a substrate, a plurality of channel layers vertically spaced apart from each other on the active region and including a semiconductor material, a gate structure extending in a second direction on the substrate, and a source/drain region disposed on the active region on at least one side of the gate structure. The gate structure intersects the active region and the plurality of channel layers, and surrounds the plurality of channel layers. The source/drain region contacts the plurality of channel layers and includes first impurities. In at least a portion of the plurality of channel layers, a lower region adjacent to the active region includes the first impurities and second impurities at a first concentration, and an upper region includes the first impurities and the second impurities at a second concentration lower than the first concentration.

20 Claims, 14 Drawing Sheets

(51) Int. Cl.
  *H01L 29/06*    (2006.01)
  *H01L 29/161*   (2006.01)
  *H01L 29/167*   (2006.01)
  *H01L 29/417*   (2006.01)
  *H01L 29/423*   (2006.01)
  *H01L 29/66*    (2006.01)

(52) U.S. Cl.
  CPC .... *H01L 21/02579* (2013.01); *H01L 21/0259* (2013.01); *H01L 29/0665* (2013.01); *H01L 29/167* (2013.01); *H01L 29/42392* (2013.01); *H01L 29/66545* (2013.01); *H01L 29/66553* (2013.01); *H01L 29/66742* (2013.01); *H01L 29/78618* (2013.01)

(56) References Cited

U.S. PATENT DOCUMENTS

| | | |
|---|---|---|
| 2014/0353574 A1 | 12/2014 | Li et al. |
| 2018/0197965 A1 | 7/2018 | Adusumilli et al. |
| 2019/0267494 A1 | 8/2019 | Kim et al. |
| 2020/0105617 A1 | 4/2020 | Wang et al. |
| 2020/0105893 A1* | 4/2020 | Xiao ................... H01L 27/0688 |
| 2020/0119167 A1 | 4/2020 | More et al. |
| 2020/0266060 A1 | 8/2020 | Cheng et al. |
| 2020/0287055 A1* | 9/2020 | Lee .................... H01L 29/6681 |

\* cited by examiner

SEMICONDUCTOR DEVICES

CROSS-REFERENCE TO RELATED APPLICATION(S)

This application claims priority under 35 U.S.C. 119(a) to Korean Patent Application No. 10-2021-0001407, filed on Jan. 6, 2021 in the Korean Intellectual Property Office, the disclosure of which is incorporated by reference herein in its entirety.

TECHNICAL FIELD

Embodiments of the present inventive concept relate to a semiconductor device.

DISCUSSION OF RELATED ART

As demand for high performance semiconductor devices increases, high speed, multifunctionalization, and the degree of integration of semiconductor devices is also increasing. In manufacturing a semiconductor device having a fine pattern corresponding to the trend of high integration of semiconductor devices, patterns having a fine width or a fine separation distance are implemented. In addition, efforts are being made to develop a semiconductor device including a fin field-effect transistor (FinFET) having a three-dimensional channel to reduce the limitation of operating characteristics due to the reduction in the size of a planar metal oxide semiconductor FET (MOSFET).

SUMMARY

Example embodiments provide a semiconductor device having increased reliability.

According to an example embodiment, a semiconductor device includes an active region extending in a first direction on a substrate, a plurality of channel layers vertically spaced apart from each other on the active region and including a semiconductor material, a gate structure extending in a second direction on the substrate, and a source/drain region disposed on the active region on at least one side of the gate structure. The gate structure intersects the active region and the plurality of channel layers, and surrounds the plurality of channel layers. The source/drain region contacts the plurality of channel layers and includes first impurities. In at least a portion of the plurality of channel layers, a lower region adjacent to the active region includes the first impurities and second impurities at a first concentration, and an upper region includes the first impurities and the second impurities at a second concentration lower than the first concentration.

According to an example embodiment, semiconductor device, includes an active region extending in a first direction on a substrate, first and second channel layers vertically spaced apart from each other on the active region, a gate structure extending in a second direction on the substrate, and a source/drain region disposed on the active region, on at least one side of the gate structure, and in contact with the first and second channel layers. The gate structure intersects the active region and the first and second channel layers, and surrounds the first and second channel layers. The first channel layer includes impurities of a first concentration in a lower portion of the first channel layer and the impurities of a second concentration in an upper portion of the first channel layer, and the second channel layer includes the impurities of a third concentration in a lower portion of the second channel layer and the impurities of a fourth concentration in an upper portion of the second channel layer. The first to fourth concentrations are sequentially lowered.

According to an example embodiment, a semiconductor device includes an active region extending in a first direction on a substrate, a plurality of channel layers vertically spaced apart from each other on the active region, and respectively including a first semiconductor material and a second semiconductor material, a gate structure extending in a second direction on the substrate, and a source/drain region disposed on the active region, on at least one side of the gate structure, and in contact with the plurality of channel layers. The gate structure intersects the active region and the plurality of channel layers, and surrounds the plurality of channel layers. A concentration of the second semiconductor material increases from a central portion of each of the plurality of channel layers to a first region adjacent to a lower surface of each of the plurality of channel layers and having a first concentration and to a second region adjacent to an upper surface of each of the plurality of channel layers and having a second concentration, the first and second concentrations being different from each other.

BRIEF DESCRIPTION OF THE DRAWINGS

The above and other features of the present inventive concept will become more apparent by describing in detail embodiments thereof with reference to the accompanying drawings, in which.

DETAILED DESCRIPTION

Figure 1:
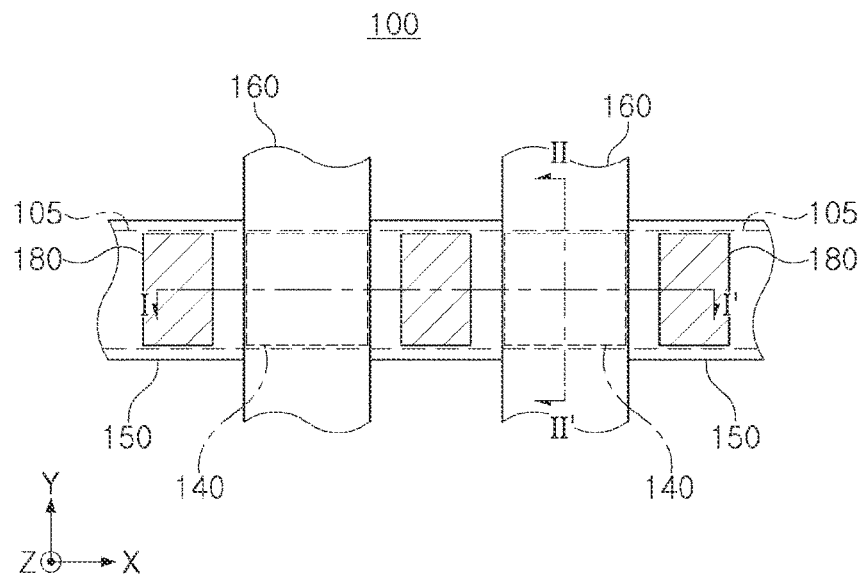
FIG. 1 is a plan view illustrating a semiconductor device according to example embodiments.

Example embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an example embodiment may be described as a "second" element in another example embodiment.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

It will be understood that when a component such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when elements are described as being substantially coplanar with one another, it is to be understood that elements are exactly coplanar with one another, or almost coplanar with one another (e.g., within a measurement error), as would be understood by a person having ordinary skill in the art. Further, when one value is described as being about the same as or about equal to another value, it is to be understood that the values are equal to each other to within a measurement error, or if measurably unequal, are close enough in value to be functionally equal to each other as would be understood by a person having ordinary skill in the art. It will be further understood that when two components or directions are described as extending substantially parallel or perpendicular to each other, the two components or directions extend exactly parallel or perpendicular to each other, or extend approximately parallel or perpendicular to each other as would be understood by a person having ordinary skill in the art (e.g., within a measurement error). Other uses of the terms "substantially" and "about" should be interpreted in a like fashion.

Figure 2A:
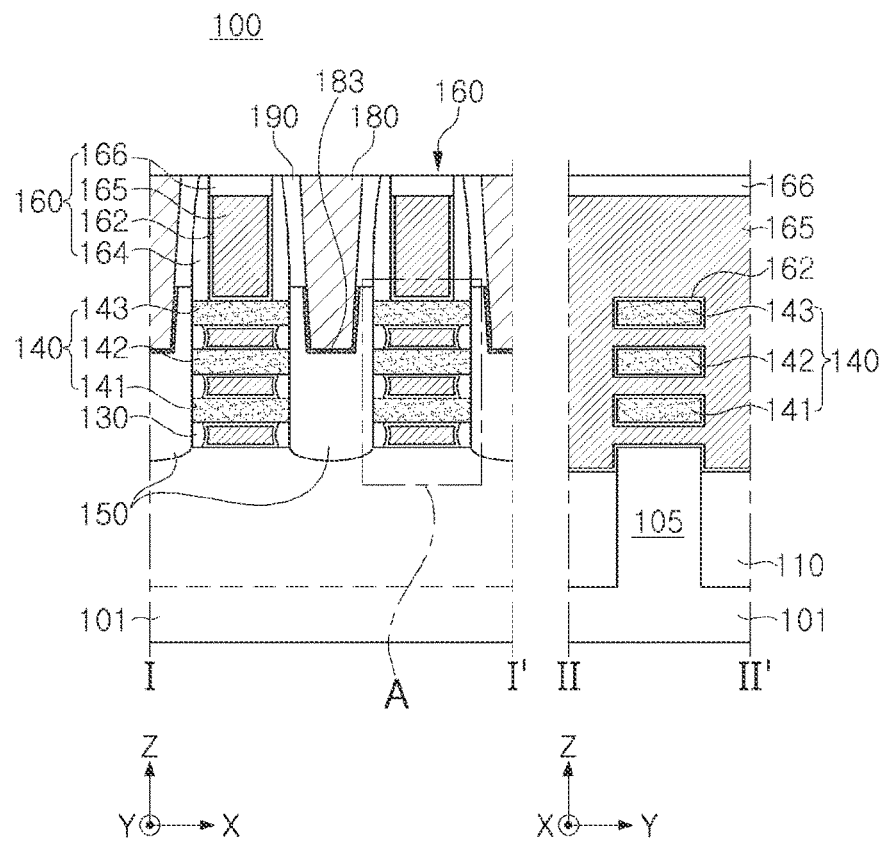
FIG. 2A is a cross-sectional view illustrating a semiconductor device according to example embodiments.
Figure 2B:
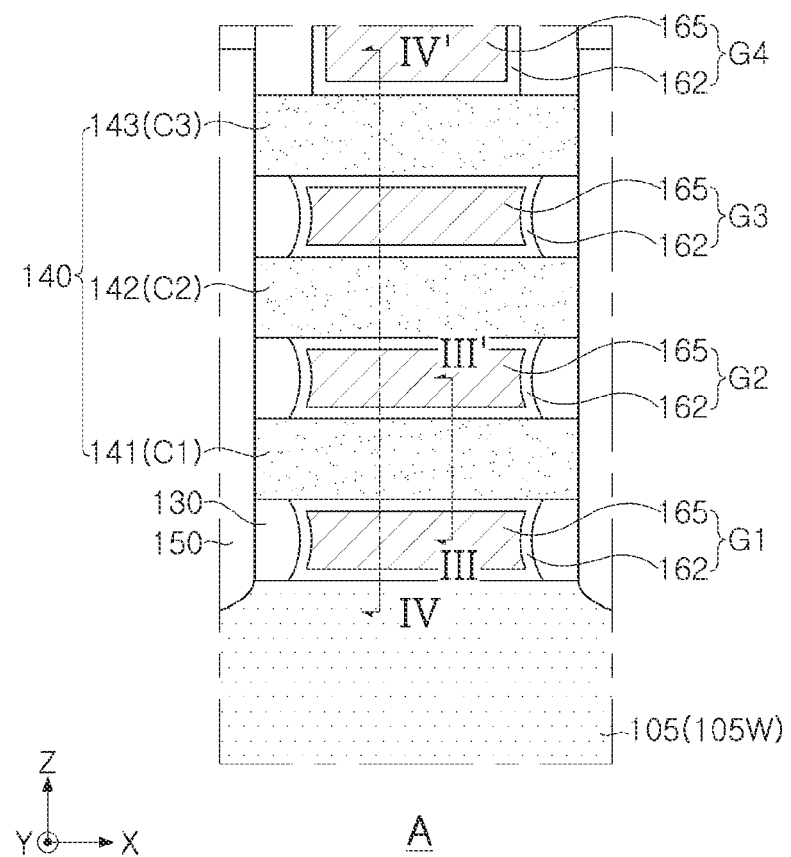
FIG. 2B is a partially enlarged view illustrating area "A" of FIG. 2A according to example embodiments.

FIG. 1 is a plan view illustrating a semiconductor device 100 according to example embodiments. FIG. 2A is a cross-sectional view of the semiconductor device of FIG. 1 taken along lines I-I' and II-II' according to example embodiments. FIG. 2B is a partially enlarged view illustrating area "A" of FIG. 2A according to example embodiments. For convenience of description, only major components of a semiconductor device are illustrated in FIGS. 1, 2A, and 2B.

Referring to FIGS. 1, 2A, and 2B, a semiconductor device 100 may include a substrate 101, an active region 105 disposed on the substrate 101, channel structures 140 including a plurality of channel layers 141, 142 and 143 vertically spaced apart from each other on the active region 105, source/drain regions 150 in contact with the plurality of channel layers 141, 142 and 143, gate structures 160 intersecting the active region 105, and contact plugs 180 connected to the source/drain regions 150. The semiconductor device 100 may further include device isolation layers 110, inner spacer layers 130, and interlayer insulating layers 190. The gate structure 160 may include a gate dielectric layer 162, a gate electrode 165, spacer layers 164, and a gate capping layer 166.

In the semiconductor device 100, the active region 105 may have a fin structure, and the gate electrode 165 may be disposed between the active region 105 and the channel structure 140, between the plurality of channel layers 141, 142 and 143 of the channel structures 140, and on an upper portion of the channel structure 140. Accordingly, the semiconductor device 100 may include a transistor having a multi-bridge channel FET (MBCFET™) structure, which is a gate-all-around field effect transistor with the channel structures 140, the source/drain region 150, and the gate structures 160.

The substrate 101 may have an upper surface extending in the X and Y directions. The substrate 101 may include a semiconductor material such as, for example, a group IV semiconductor, a group III-V compound semiconductor, or a group II-VI compound semiconductor. For example, the group IV semiconductor may include silicon, germanium, or silicon-germanium. The substrate 101 may be provided as, for example, a bulk wafer, an epitaxial layer, a silicon-on-insulator (SOI) layer, a semiconductor-on-insulator (SeOI) layer, or the like.

The device isolation layer 110 may define the active region 105 in the substrate 101. The device isolation layer 110 may be formed by, for example, a shallow trench isolation (STI) process. According to example embodiments, the device isolation layer 110 may further include a region extending relatively deeper while having a step in a lower portion of the substrate 101. The device isolation layer 110 may partially expose the upper portion of the active region 105. According to example embodiments, the device isolation layer 110 may also have a curved upper surface having a higher level adjacent to the active region 105. The device isolation layer 110 may be formed of an insulating material. The device isolation layer 110 may be formed of, for example, an oxide, a nitride, or a combination thereof.

The active region 105 is defined by the device isolation layer 110 in the substrate 101 and may extend in a first direction, for example, in the X direction. The active region 105 may have a structure protruding from the substrate 101. The upper end of the active region 105 may protrude from the upper surface of the device isolation layer 110 to a predetermined height. The active region 105 may be formed as a portion of the substrate 101 or may include an epitaxial layer grown from the substrate 101. However, on both sides of the gate structures 160, the active region 105 on the substrate 101 is partially recessed, and source/drain regions 150 may be disposed on the recessed active region 105.

The active region 105 may include impurities or a doped region (or impurity region) including impurities (105W in FIG. 2B). The impurity region 105W may correspond to a well region of a transistor. Accordingly, in the case of a p-type transistor (pFBT), the impurity region 105W may include n-type impurities such as, for example, phosphorus (P), arsenic (As), or antimony (Sb), and in the case of the n-type transistor (nFET), the impurity region 105W may include p-type impurities such as, for example, boron (B), gallium (Ga), or aluminum (Al). The impurity region 105W may have a predetermined depth from the upper surfaces of the active region 105 and the substrate 101. However, since the position of the impurity region 105W may be determined differently, depending on how the concentration of the impurities contained therein is defined, the range of the impurity region 105W may be changed depending on the concentration criterion of the impurities in example embodiments.

The channel structure 140 may include first to third channel layers 141, 142, and 143, which are two or more channel layers spaced apart from each other in a direction substantially perpendicular to the upper surface of the active region 105, for example, in a Z direction, above the active region 105. The first to third channel layers 141, 142, and 143 may be connected to the source/drain regions 150 and spaced apart from the upper surface of the active region 105. The first to third channel layers 141, 142, and 143 may have substantially the same or a similar width as the active region 105 in the Y direction, and may have substantially the same or a similar width as the gate structure 160 in the X direction. However, depending on example embodiments, the first to third channel layers 141, 142, and 143 may have a reduced width in such a manner that side surfaces are located below the gate structure 160, in the X direction. For example, the widths of the first to third channel layers 141, 142, and 143 in the X direction may decrease upwardly in the Z direction, and accordingly, the width of the gate structure 160 in the X direction, disposed on respective lower portions of the first to third channel layers 141, 142, and 143, may also decrease toward the top in the Z direction.

The first to third channel layers 141, 142, and 143 may be formed of a semiconductor material, and may include at least one of, for example, silicon (Si), silicon germanium (SiGe), or germanium (Ge). The first to third channel layers 141, 142, and 143 may be formed of, for example, the same material as the substrate 101. According to example embodiments, the first to third channel layers 141, 142, and 143 may include an impurity region positioned in a region adjacent to the source/drain region 150. The number and shape of the channel layers 141, 142, and 143 constituting one channel structure 140 may be variously changed in example embodiments. For example, according to example embodiments, the channel structure 140 may further include a channel layer disposed on the upper surface of the active region 105.

The source/drain regions 150 may be disposed on the active region 105, on both sides of the channel structure 140. The source/drain region 150 may be disposed on the respective side surfaces of the first to third channel layers 141, 142, and 143 of the channel structure 140, and may cover the upper surface of the active region 105 by a lower end of the source/drain region 150. The source/drain region 150 may be disposed by partially recessing the upper portion of the active region 105, but in example embodiments, the presence or absence of the recess and the depth of the recess may be changed variously. The source/drain regions 150 may be a semiconductor layer including silicon (Si), and may include impurities of different types and/or concentrations.

The gate structure 160 may be disposed on the active region 105 and the channel structures 140 to intersect the active region 105 and the channel structures 140, and may extend in one direction, for example, in the Y direction. Channel regions of transistors may be formed in the active region 105 and/or the channel structures 140 intersecting the gate structure 160. The gate structure 160 may include a gate electrode 165, a gate dielectric layer 162 disposed between the gate electrode 165 and the plurality of channel layers 141, 142, and 143, gate spacer layers 164 disposed on side surfaces of the gate electrode 165, and a gate capping layer 166 disposed on the upper surface of the gate electrode 165. The gate structure 160 may surround the plurality of channel layers 141, 142 and 143.

The gate dielectric layer 162 may be disposed between the active region 105 and the gate electrode 165 and between the channel structure 140 and the gate electrode 165, and may cover at least a portion of the surfaces of the gate electrode 165. For example, the gate dielectric layer 162 may surround all surfaces of the gate electrode 165 except for an uppermost upper surface of the gate electrode 165. The gate dielectric layer 162 may extend between the gate electrode 165 and the spacer layers 164, but the configuration is not limited thereto. The gate dielectric layer 162 may include, for example, oxide, nitride, or a high-k material. The high-k material may indicate a dielectric material having a dielectric constant higher than that of a silicon oxide film ($SiO_2$). The high-k material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed on the active region 105 to fill areas between the plurality of channel layers 141, 142, and 143, and may extend upwardly of the channel structure 140. The gate electrode 165 may be spaced apart from the plurality of channel layers 141, 142, and 143 by the gate dielectric layer 162. The gate electrode 165 may include a conductive material, for example, a metal nitride such as a titanium nitride film (TiN), a tantalum nitride film (TaN) or a tungsten nitride film (WN), and/or a metal material such as aluminum (Al), tungsten (W) or molybdenum (Mo), or a semiconductor material such as doped polysilicon. The gate electrode 165 may be formed of two or more multiple layers. The gate electrode 165 may be separated and disposed between at least some adjacent transistors by a separate separation unit according to the configuration of the semiconductor device 100.

The gate spacer layers 164 may be disposed on both sides of the gate electrode 165. The gate spacer layers 164 may insulate the source/drain regions 150 and the gate electrodes 165 from each other. The gate spacer layers 164 may have a multilayer structure according to example embodiments. In example embodiments, the gate spacer layers 164 may be formed of, for example, oxide, nitride, and oxynitride. In example embodiments, the gate spacer layers 164 may be formed of a low-k film.

The gate capping layer 166 may be disposed on the gate electrode 165, and the lower surfaces and side surfaces thereof may be surrounded by the gate electrode 165 and the gate spacer layers 164, respectively.

The inner spacer layers 130 may be disposed substantially in parallel with the gate electrode 165, between the channel structures 140. For example, the inner spacer layers 130 may be disposed on both sides of the gate structure 160 in the X direction, while being disposed on the lower surfaces of the plurality of channel layers 141, 142, and 143, respectively. Below the third channel layer 143, the gate electrode 165 may be separated from the source/drain regions 150 by the inner spacer layers 130 and may be electrically separated therefrom. The inner spacer layers 130 may have a shape in which a side surface facing the gate electrode 165 is convexly rounded inwardly, toward the gate electrode 165, but the shape is not limited thereto. In example embodiments, the inner spacer layers 130 may be formed of, for example, oxide, nitride, and oxynitride. In example embodiments, the inner spacer layers 130 may be formed of a low-k film.

The contact plug 180 may penetrate through the interlayer insulating layer 190 to be connected to the source/drain region 150 and may apply an electrical signal to the source/drain region 150. The contact plug 180 may be disposed on the source/drain region 150 as illustrated in FIG. 1, and depending on example embodiments, the contact plug 180 may also be disposed to have a longer length than the source/drain region 150 in the Y direction. The contact plug 180 may have an inclined side surface in which the width of the lower portion is narrower than the width of the upper portion according to the aspect ratio, but the configuration is not limited thereto. The contact plug 180 may extend from the top, for example, to be lower than the third channel layer 143. The contact plug 180 may be recessed, for example, to a height corresponding to the upper surface of the second channel layer 142, but the configuration is not limited thereto. In example embodiments, the contact plug 180 may be in contact along the upper surface of the source/drain region 150 without recessing into the source/drain region 150. The contact plug 180 may include a metal nitride such as, for example, a titanium nitride film (TiN), a tantalum nitride film (TaN), or a tungsten nitride film (WN), and/or a metal material such as, for example, aluminum (Al), tungsten (W), molybdenum (Mo), or the like.

A bottom surface and a portion of a side surface of the contact plug 180 may be covered with a metal-semiconductor compound layer 183 between the source/drain region 150 and the contact plug 180. The metal-semiconductor compound layer 183 may be, for example, a metal-silicon alloy layer, a metal-germanium alloy layer, or a metal-silicon-germanium alloy layer. In this case, the metal in the metal-semiconductor compound layer 183 may be, for example, titanium (Ti), tantalum (Ta), nickel (Ni), or cobalt (Co).

The interlayer insulating layer 190 may cover the source/drain regions 150 and the gate structures 160, and may cover the device isolation layer 110, for example, in a region not illustrated. The interlayer insulating layer 190 may include at least one of, for example, oxide, nitride, or oxynitride, and may include a low dielectric constant material.

Figure 3:
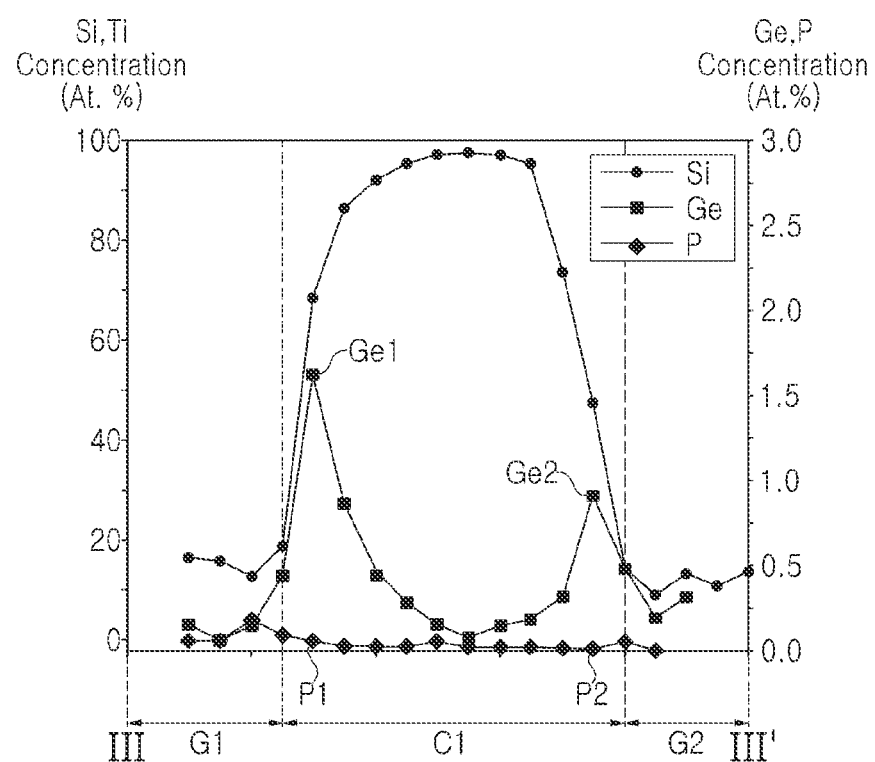
FIG. 3 is a graph illustrating the concentration of impurities in a region taken along line III-III' of FIG. 2B according to example embodiments.

Hereinafter, referring to FIGS. 3 and 4A to 4D along with FIG. 2B, impurities accumulated between the plurality of channel layers 141, 142, and 143 of the channel structure 140 and the gate structures 160 will be described. FIG. 3 is a graph illustrating the concentration of impurities in a region taken along line of FIG. 2B according to example embodiments. FIGS. 4A to 4D are graphs illustrating the concentration of impurities in a region taken along line IV-IV' of FIG. 2B, respectively, according to example embodiments. FIGS. 3 and 4A to 4D illustrate changes in concentrations of impurities in the channel structure 140 and the gate structure 160 in the z-direction, respectively. In FIGS. 3 and 4A to 4D, C1, C2, and C3 represent regions corresponding to the first to third channel layers 141, 142, and 143 of FIG. 2B, and G1, G2, G3, and G4 represent regions corresponding to the gate layer in contact with the first to third channel layers 141, 142, and 143.

Referring to FIG. 3, the plurality of channel layers 141, 142, and 143 may include a semiconductor material, and the source/drain region 150 may include first impurities (e.g., phosphorus (P)). In addition, in at least a portion (for example, 141, which may hereinafter be referred to as a first channel layer C1) of the plurality of channel layers 141, 142 and 143, the lower region thereof adjacent to the active region 105 (or the impurity region 105W) may include the first impurities and the second impurities at a first concentration, and the upper region thereof may include the first impurities and the second impurities at a second concentration lower than the first concentration. For example, in an example embodiment, the channel layer 141 may be referred to as a portion of the plurality of channel layers 141, 142 and 143. This portion 141 may include a lower region (e.g., a region closest to the active region 105 (or the impurity region 105W) and may include an upper region (e.g., a region further away from the active region 105 (or the impurity region 105W) than the lower region). The lower region may include the first impurities and the second impurities at a first concentration, and the upper region may include the first impurities and the second impurities at a second concentration lower than the first concentration. In this case, the first impurities may include at least one of, for example, phosphorus (P), arsenic (As), antimony (Sb), boron (B), gallium (Ga), or aluminum (Al), and the semiconductor material may include a first semiconductor material (e.g., silicon (Si)), and the second impurities may include a second semiconductor material (e.g., germanium (Ge)) different from the first semiconductor material. The first and second semiconductor materials may include at least one of, for example, silicon (Si), silicon germanium (SiGe), or germanium (Ge). In addition, the first concentration may be a value obtained by adding the concentration of second impurities (e.g., Ge1) and the concentration of first impurities (e.g., P1), which are adjacent to the interface between the first channel layer C1 and a first gate layer G1. The second concentration may be a value obtained by adding the concentration of second impurities (e.g., Ge2) and the concentration of first impurities (e.g., P2), which are adjacent to the interface between the first channel layer C1 and a second gate layer G2. Accordingly, the first concentration may be defined as a maximum value of the concentration of impurities (hereinafter, the first impurities and the second impurities are collectively referred to as "impurities") in a lower region of the at least portion of the channel layers 141, and the second concentration may be defined as a maximum value of the concentration of the impurities in an upper region of the at least portion of the channel layers 141. In addition, the concentration of the impurities may decrease from the first concentration and the second concentration toward the center of the at least portion of the channel layer 141. In example embodiments, the first concentration and the second concentration may have a difference of about 0.2 atomic % to about 1.5 atomic %.

In addition, the concentration of the first semiconductor material (e.g., silicon (Si)) in at least a portion (e.g., 141) of the channel layers may be greater than the concentration of the second semiconductor material (e.g., germanium (Ge)). In example embodiments, the concentration of the first semiconductor material decreases as it approaches the lower and upper surfaces of at least a portion (e.g., 141) of the channel layers, and the concentration of the second semiconductor material increases from the center of at least a portion (e.g., 141) of the channel layers to a third concentration (e.g., Ge1) adjacent to the lower surface and a fourth concentration (e.g., Ge2) adjacent to the upper surface. In this case, in the at least portion (e.g., 141) of the channel layers, the concentration of the first semiconductor material may be greater than the third and fourth concentrations Ge1 and Ge2 of the second semiconductor material. For example, in an example embodiment, the concentration of the second impurities may decrease from the lower region of the channel layer 141 and the upper region of the channel layer 141 toward a central portion of the channel layer 141.

As described above, only a change in the concentration of impurities in some channel layers, for example, in the first channel layer 141 adjacent to the active region 105, is illustrated in FIG. 3, but in example embodiments, each of the plurality of the channel layers 141, 142 and 143 includes the impurities of the first concentration and the second concentration, and in this case, the concentration of the impurities may decrease as the distance from the active region 105 increases. Hereinafter, various concentration changes of impurities in the plurality of channel layers 141, 142, and 143 will be described with reference to FIGS. 4A to 4D.

Figure 4A:
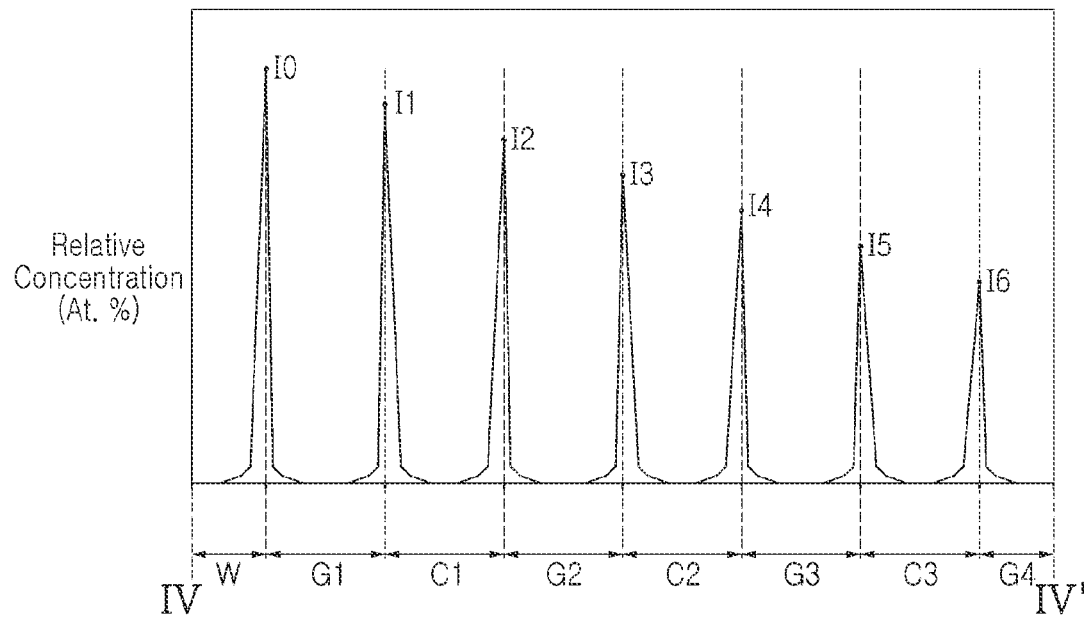
FIGS. 4A to 4D are graphs illustrating concentrations of impurities in regions taken along line IV-IV' of FIG. 2B, respectively, according to example embodiments.

Referring to FIG. 4A, each of the plurality of channel layers 141, 142, and 143 may include impurities densely located in a lower portion and an upper portion of each of the channel layers 141, 142, and 143. In this case, the impurities may include a doping element corresponding to the above-described first impurities and a semiconductor element corresponding to the second impurities. In an example embodiment, the first channel layer C1 may include the impurities of a first concentration I1 in a lower portion and the impurities of a second concentration I2 in an upper portion, and the second channel layer C2 may include the impurities of a third concentration I3 in the lower portion and the impurities of a fourth concentration I4 in the upper portion. In addition, the third channel layer C3 may include the impurities of a fifth concentration I5 in the lower portion and the impurities of a sixth concentration I6 in the upper portion. The first to sixth concentrations I1, I2, I3, I4, I5 and I6 may be relatively decreased as the distance from the active region 105 increases, which may be understood as the influence of the first impurities that are diffused from the impurity region (105W in FIG. 2B) to the top and are accumulated at the interfaces between the sacrificial layers (120 in FIG. 9G) and the plurality of channel layers 141, 142, and 143 during the process of manufacturing the semiconductor device 100. This will be described in more detail with reference to FIGS. 9A to 9J. In addition, the impurities may appear to be included in the gate layers G1, G2, G3 and G4 on the first to third channel layers C1, C2 and C3, and this phenomenon may be understood as being caused due to diffusion of the impurities concentrated at the interfaces between the first to third channel layers C1, C2 and C3 and the gate layers G1, G2, G3 and G4. The concentration I1 of the impurities in a lower portion of the first channel layer C1 may be lower than a concentration I0 of the impurities in the well region W (the active region 105 in FIG. 2B) below the first gate layer G1. In the respective graphs illustrating the concentrations of the impurities, the slope in the gate layers (G1, G2, G3, G4) may be greater than the slope in the well region (W) and the first to third channel layers (C1, C2, C3). Unlike the illustration in FIG. 4A, the positions of maximum values (I0, I1, I2, I3, I4, I5, I6) of the respective graphs may not coincide with the boundaries between the gate layers G1, G2, G3 and G4 and the well region W and the first to third channel layers C1, C2 and C3. The graph illustrated in FIG. 4A schematically illustrates the change in concentration of the impurities at the boundaries between the gate layers G1, G2, G3 and G4, the well region W and the first to third channel layers C1, C2 and C3. In example embodiments, the change in the concentration of the impurities in the plurality of channel layers 141, 142 and 143 is not limited to the specific form of the graph of FIG. 4A (e.g., the change in width of the graph, area of the graph, slope of the graph, and the like). In addition, unlike FIG. 4A, the decreased degrees of the first to sixth concentrations I1, I2, I3, I4, I5, and I6 may not be constant.

Figure 4B:
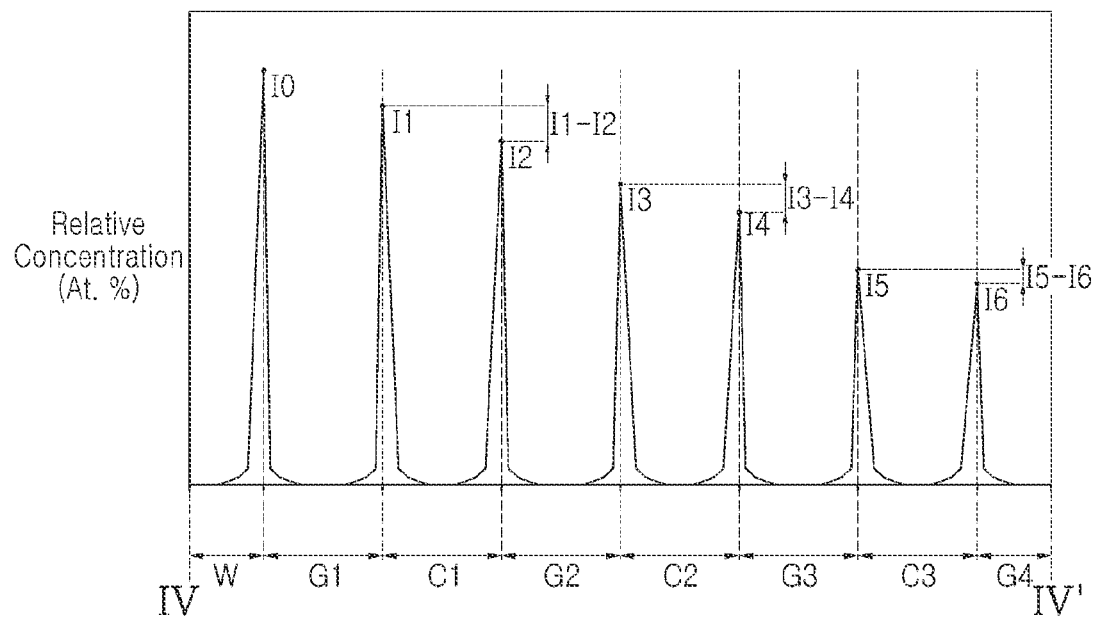

Referring to FIG. 4B, as the distance from the well region W increases, a difference in concentration of impurities concentrated in lower portions and upper portions of the plurality of channel layers 141, 142, and 143 may decrease. In an example embodiment, the concentration difference (I1–I2) of impurities in the lower and upper portions of the first channel layer C1 may be greater than the concentration difference (I3–I4) of the impurities in the lower and upper portions of the second channel layer C2. Further, the concentration difference (I3–I4) of impurities in the lower and upper portions of the second channel layer C2 may be greater than the concentration difference (I5–I6) of the impurities in the lower and upper portions of the third channel layer C3. This may be understood as a difference in concentration of impurities generated by the first impurities diffused in the well region W being decreased as the channel layer is located in a relatively higher position.

Figure 4C:
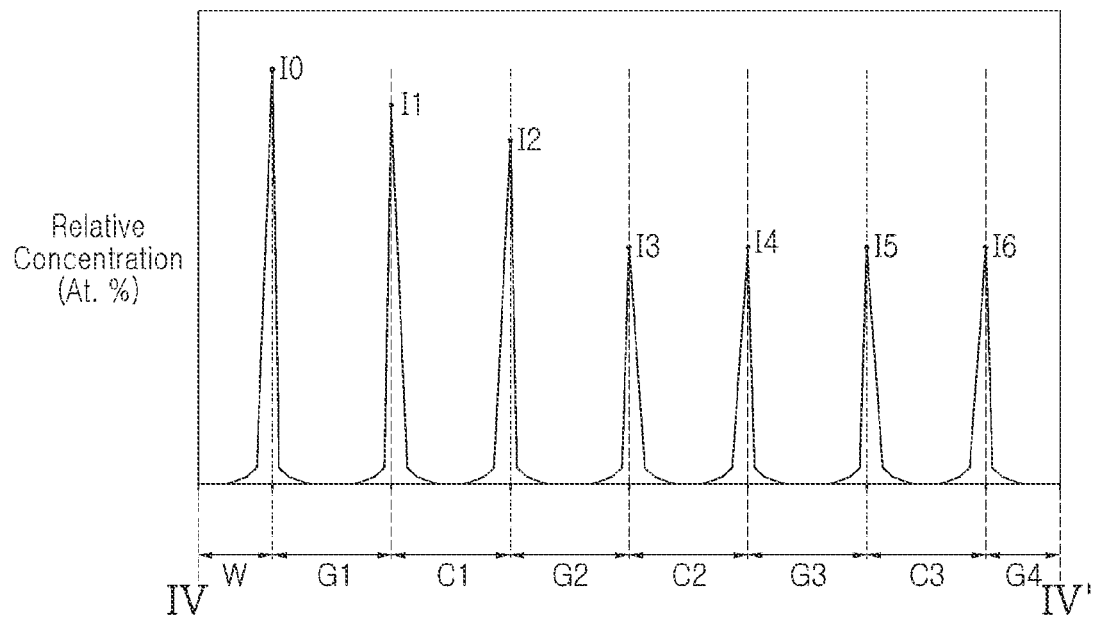

Referring to FIG. 4C, unlike the first channel layer C1 having a difference in concentration of impurities in the lower region and the upper region, the second and third channel layers C2 and C3 may have an insignificant difference in concentrations of impurities in the lower region and the upper region. In addition, the concentrations (I3, I4, I5 and I6) of impurities in the lower and upper regions of the second and third channel layers C2 and C3 may be lower than the concentrations (I1 and I2) of the impurities in the lower and upper regions of the first channel layer C1. This concentration distribution may also be understood as being due to a reduction in influence of the first impurities diffused in the well region W.

Figure 4D:
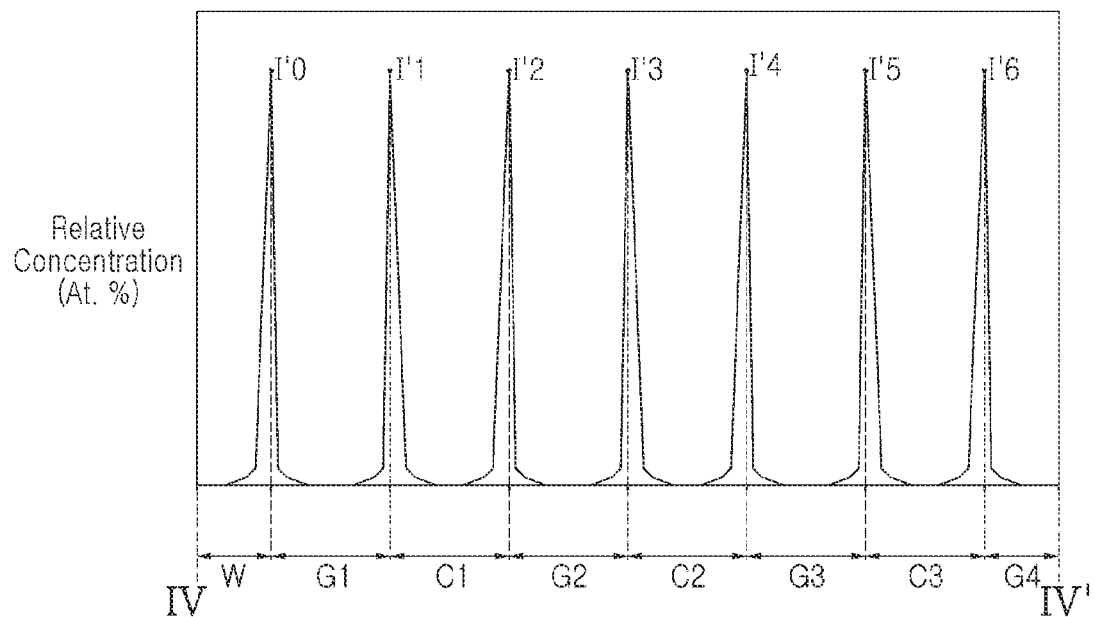

Referring to FIG. 4D, in an example embodiment, concentrations (I'1, I'2, I'3, I'4, I'5, and I'6) of impurities in lower and upper regions of the plurality of channel layers 141, 142 and 143 may be at substantially the same level, which may be understood as the influence of first impurities diffused from the source/drain regions (150 in FIG. 2B) and the second impurities diffused from the sacrificial layers (120 in FIG. 9G), rather than the first impurities diffused in the well region W, unlike the illustration in FIGS. 4A to 4C.

As described above, in example embodiments, impurities may be concentrated in a lower region and an upper region of each of the plurality of channel layers 141, 142, and 143, and the concentration graphs of the impurities may be variously modified under the influence of doping concentration of the well region W and the source/drain regions (150 in FIG. 2B), the heat treatment conditions before removing the sacrificial layers (120 in FIG. 9G), or the like, in the manufacturing process of the semiconductor device 100. In example embodiments, the plurality of channel layers 141, 142, and 143 in which impurities are concentrated in lower regions and upper regions, and a gate structure 160 surrounding the same, may be included, and thus, a multi-channel structure between the source/drain regions 150 may be implemented, and electrical characteristics and/or reliability of the semiconductor device 100 may be improved.

Figure 5:
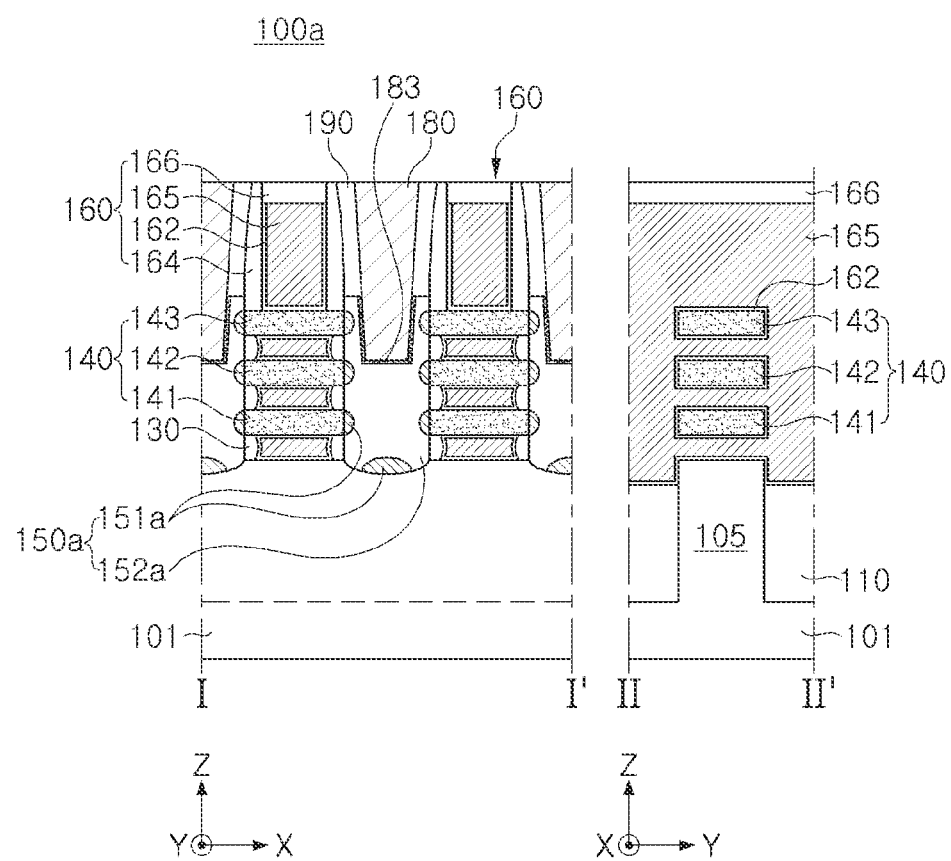
FIG. 5 is a cross-sectional view illustrating a semiconductor device according to example embodiments.

FIG. 5 is a cross-sectional view illustrating a semiconductor device 100a according to example embodiments. For convenience of explanation, a further description of elements and technical aspects previously described with reference to FIG. 2A may be omitted.

Referring to FIG. 5, a source/drain region 150a may include first epitaxial layers 151a disposed in a lower portion of the source/drain region 150a and on side surfaces of the plurality of channel layers 141, 142, and 143 in the X direction, and a second epitaxial layer 152a filling areas between the plurality of first epitaxial layers 151a. All of the first epitaxial layers 151a and the second epitaxial layer 152a may include silicon (Si), and may include different elements and/or doping elements having different concentrations. The doping elements may include at least one of n-type doping elements such as, for example, phosphorus (P), arsenic (As), or antimony (Sb), and p-type doping elements such as, for example, boron (B), gallium (Ga), or aluminum (Al). In some embodiments, the number of epitaxial layers constituting the source/drain region 150 may be variously changed.

The first epitaxial layer 151a may be, for example, a SiAs layer, a SiP layer, or a SiGeP layer including first elements such as arsenic (As) and/or phosphorus (P). The first epitaxial layer 151a may be a layer having an epitaxially grown crystal structure, and may further include a seed layer for growth. The first epitaxial layers 151a are spaced apart from each other on both inner walls of the source/drain region 150, thereby suppressing a short channel effect due to diffusion of impurities in the second epitaxial layer 152a. For example, the first elements of the first epitaxial layer 151a may include an element having a size larger than that of the second elements in the second epitaxial layer 152a. In this case, by more effectively preventing or reducing the diffusion of the second elements, the aforementioned short channel effect may be more effectively suppressed.

The second epitaxial layer 152a may completely fill the recess region (refer to "RC" in FIG. 9D) of the source/drain region 150, and may be a region in which doping elements are included in a higher concentration than that in the first epitaxial layer 151a. The second epitaxial layer 152a may be an epitaxially grown layer, and thus may have a crystal structure continuously connected to the first epitaxial layer 151a. Since both the first epitaxial layer 151a and the second epitaxial layer 152a are formed as epitaxial layers, damage to the film quality due to the ion implantation process, which may occur when formed as a doped region, may be prevented or reduced, and thus, electrical characteristics of the semiconductor device 100a may be improved.

The second elements included in the second epitaxial layer 152a may be the same as or different from the first elements. For example, the second epitaxial layer 152a may be a SiP layer containing phosphorus (P). A portion of the second elements of the second epitaxial layer 152a may be diffused into the adjacent first epitaxial layer 151a and may be partially included in the first epitaxial layer 151a. Similarly, a portion of the first elements of the first epitaxial layer 151a may be diffused into the adjacent second epitaxial layer 152a and may be partially included in the second epitaxial layer 152a. The second epitaxial layer 152a may be disposed on the bottom surface of the recess region to contact the active region 105 of the substrate 101.

In example embodiments, the first impurities in the source/drain region 150 include the first element and the second element, and the source/drain region 150 includes the first epitaxial layers 151a and the second epitaxial layer 152a. The first epitaxial layers are disposed below the source/drain region 150 and on side surfaces of the channel layers 141, 142 and 143, and respectively include the first element. The second epitaxial layer 152a fills areas between the first epitaxial layers 151a and includes the second element. In example embodiments, the first element includes arsenic (As) and the second element includes phosphorus (P). In example embodiments, the first impurities included in the at least a portion of the channel layers 141, 142 and 143 described above (e.g., the portion being 141) include the second element.

Figure 6:
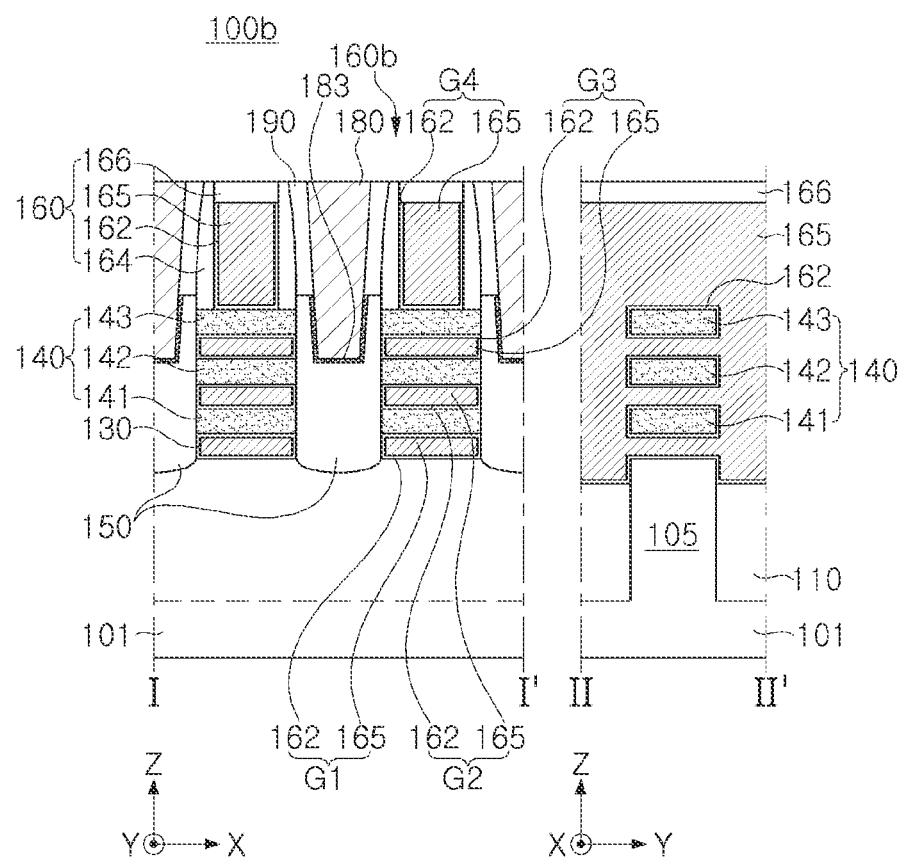
FIG. 6 is a cross-sectional view illustrating a semiconductor device according to example embodiments.

FIG. 6 is a cross-sectional view illustrating a semiconductor device 100b according to example embodiments. For convenience of explanation, a further description of elements and technical aspects previously described with reference to FIG. 2A may be omitted.

Referring to FIG. 6, unlike the example embodiment described above with reference to FIG. 2A, in an example embodiment, the semiconductor device 100b does not include an inner spacer layer 130. Between the first to third channel layers 141, 142, and 143 of the channel structure 140, the gate electrode 165 (or the first to third gate layers G1, G2 and G3) may be disposed to extend in the X direction. Accordingly, both side surfaces of a gate structure 160b in the X direction may be positioned vertically substantially in parallel with both side surfaces of the channel structure 140, and may be substantially coplanar. The fourth gate layer G4, which is an uppermost layer of the gate structure 160b, may have a width less than the widths of the first to third gate layers G1, G2, and G3 in the X direction.

Figure 7:
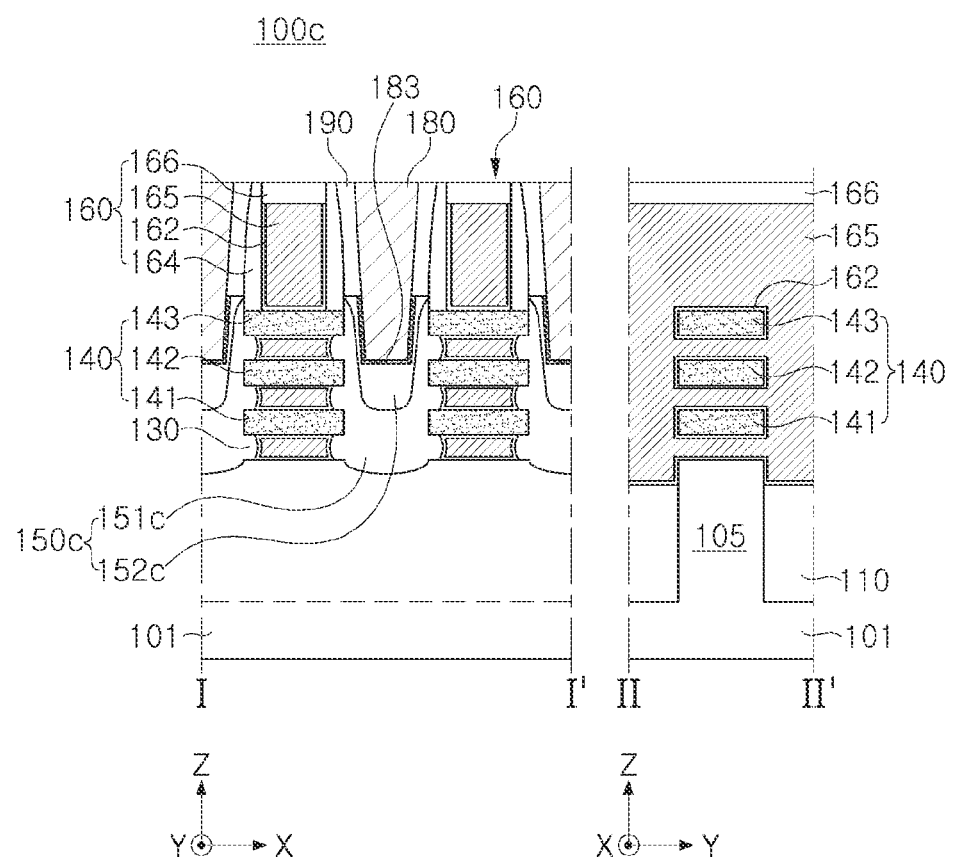
FIG. 7 is a cross-sectional view illustrating a semiconductor device according to example embodiments.

FIG. 7 is a cross-sectional view illustrating a semiconductor device 100c according to example embodiments. For convenience of explanation, a further description of elements and technical aspects previously described with reference to FIG. 2A may be omitted.

Referring to FIG. 7, in a source/drain region 150c of the semiconductor device 100c, a first epitaxial layer 151c may have a form extending along side surfaces of the first to third channel layers 141, 142 and 143 of the channel structure 140 and the side surface of the gate structure 160, and forming the lower surface of the source/drain regions 150c, as a lower end portion thereof. Accordingly, the first epitaxial layer 151c may have a shape completely surrounding the lower surface and the side surface of the second epitaxial layer 152c in the X direction. Accordingly, in an example embodiment, the second epitaxial layer 152c does not directly contact the active region 105. An upper end of the first epitaxial layer 151c may contact the gate spacer layers 164, but the configuration is not limited thereto. In addition, the first epitaxial layer 151c may have a shape protruding toward the side surface of the gate structure 160, on the lower surface of each of the first to third channel layers 141, 142, and 143.

The structure as described above may be implemented by omitting the inner spacer layers 130 and by forming the source/drain regions 150c similarly to the description with reference to FIG. 5, in the operation of forming inner spacer layers 130 and source/drain regions 150 with reference to FIGS. 9F and 9G to be described below.

Figure 8:
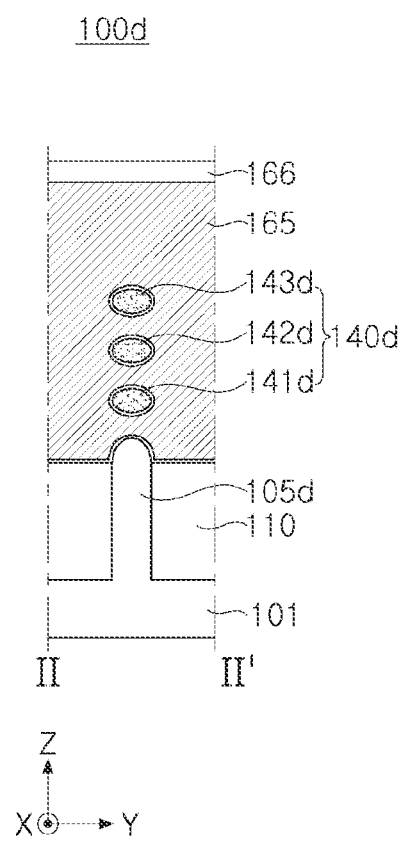
FIG. 8 is a cross-sectional view illustrating a semiconductor device according to example embodiments.

FIG. 8 is a cross-sectional view illustrating a semiconductor device 100d according to example embodiments. For convenience of explanation, a further description of elements and technical aspects previously described may be omitted.

Referring to FIG. 8, in the semiconductor device 100d, the widths of an active region 105d and a channel structure 140d may be different from those of the example embodiments of FIGS. 2A and 2B. The active region 105d and the channel structure 140d may have a relatively small width, and accordingly, a plurality of channel layers 141d, 142d, and 143d of the channel structure 140d may each have a circular shape or an elliptical shape in which a difference in length between the major axis and the minor axis is relatively small, in a cross-section thereof in the Y direction. For example, in the example embodiment of FIGS. 2A and 2B, the plurality of channel layers 141, 142, and 143 may have a width of about 20 nm to about 50 nm in the Y direction, and the plurality of channel layers 141d, 142d and 143d of an embodiment according to FIG. 8 may have a width of about 3 nm to about 12 nm in the Y direction. As described above, in example embodiments, the width and shape of the active region 105d and the channel structure 140d may be variously changed.

FIGS. 9A to 9J are diagrams illustrating a process sequence to describe a method of manufacturing a semiconductor device according to example embodiments.

Figure 9A:
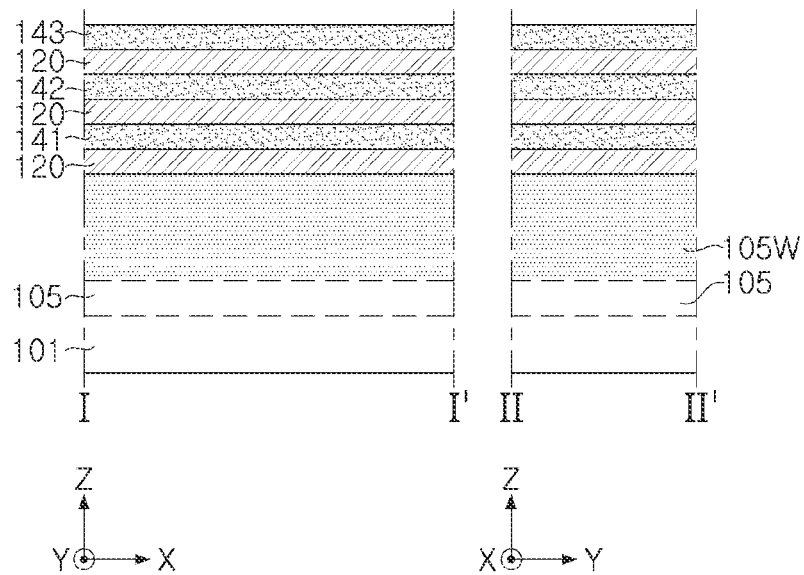
FIGS. 9A to 9J are diagrams illustrating a process sequence to describe a method of manufacturing a semiconductor device according to example embodiments.

Referring to FIG. 9A, an impurity region 105W is formed in a substrate 101, and sacrificial layers 120 and channel layers 141, 142, and 143 may be alternately stacked on the impurity region 105W.

The impurity region 105W may be formed by an ion implantation process, and may be formed to have a maximum concentration of impurities in a region spaced apart from the upper surface of the substrate 101 to a predetermined depth. Impurities in the impurity region 105W may be diffused through high-temperature processes in a process of manufacturing a semiconductor device, and accordingly, the impurity region 105W may also be expanded.

Figure 9B:
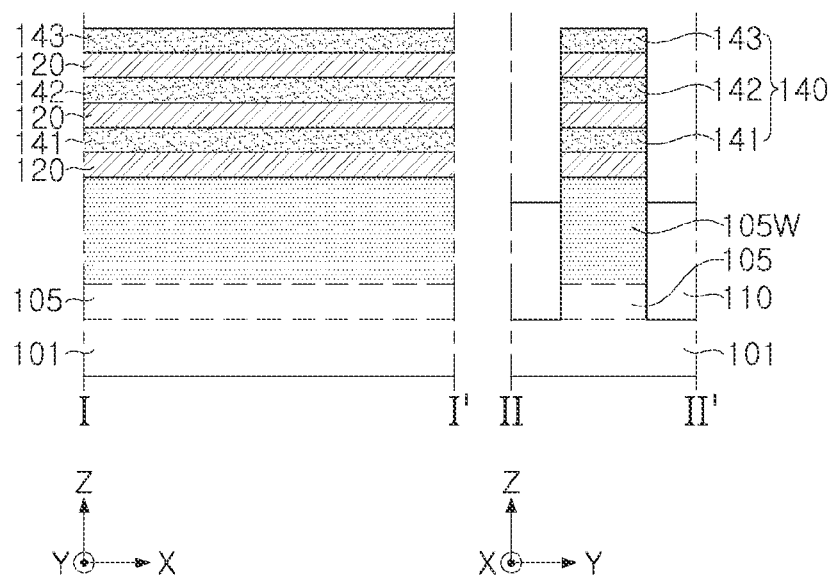
Figure 9C:
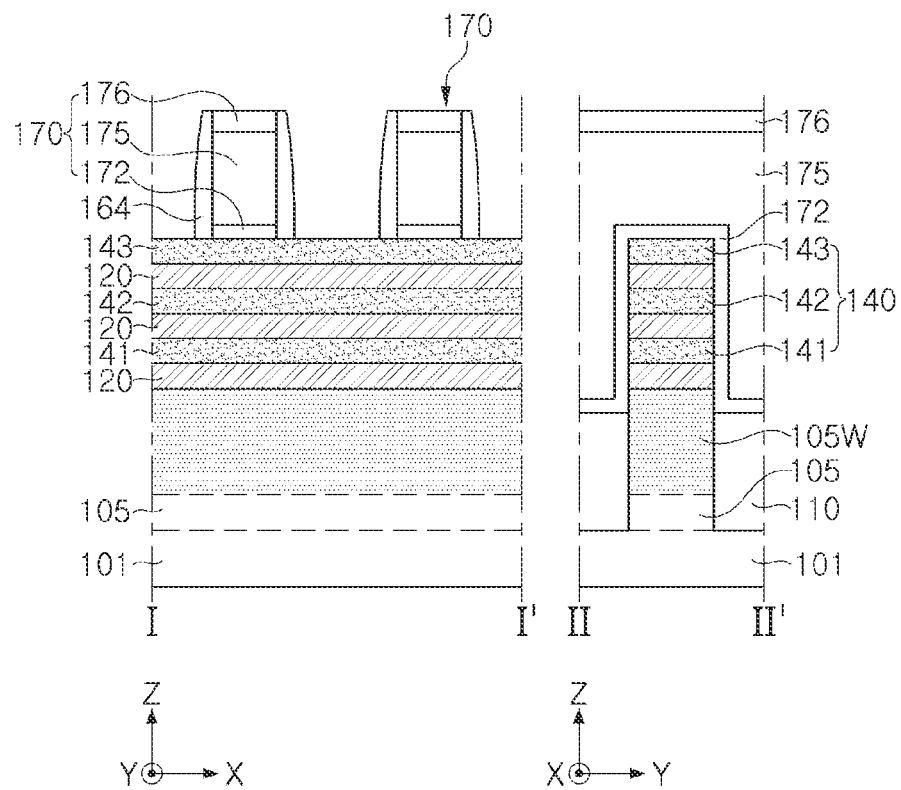
Figure 9D:
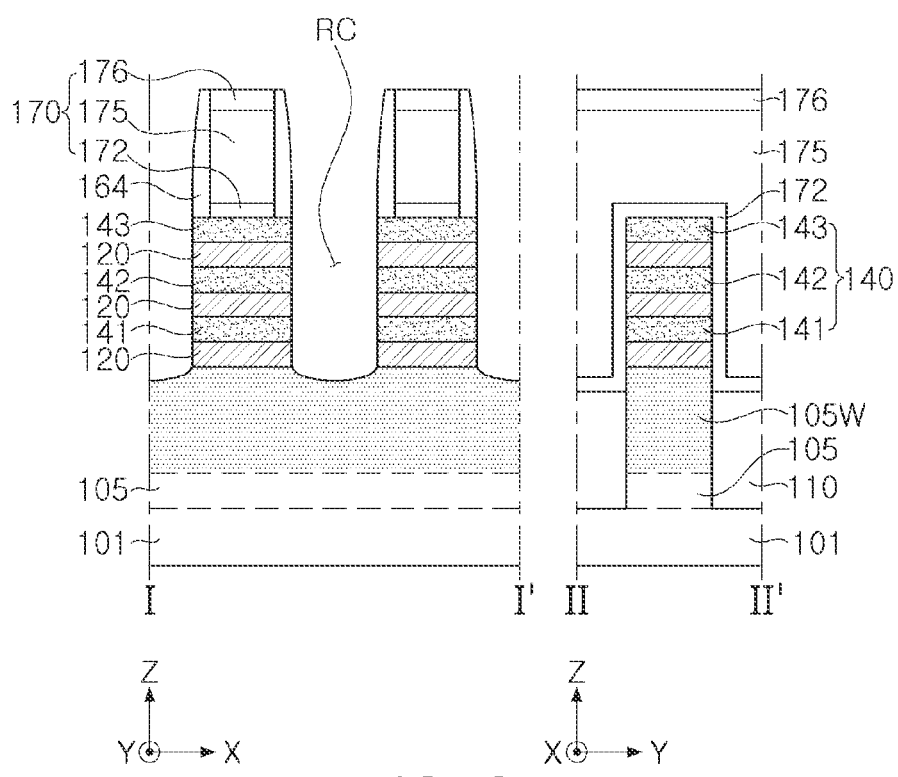
Figure 9E:
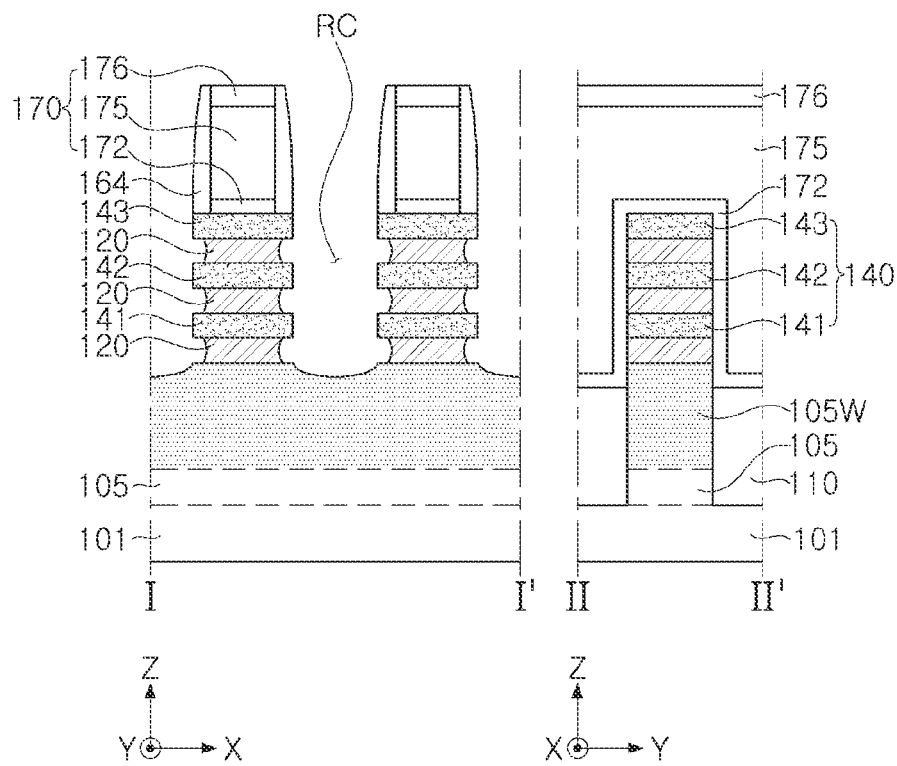
Figure 9F:
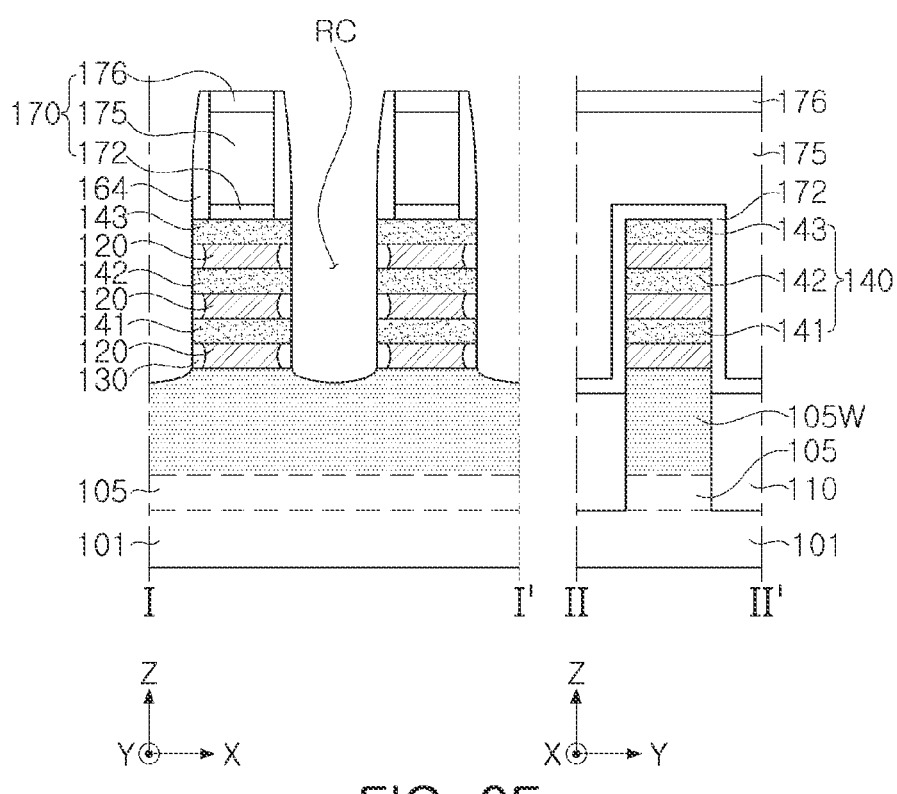
Figure 9G:
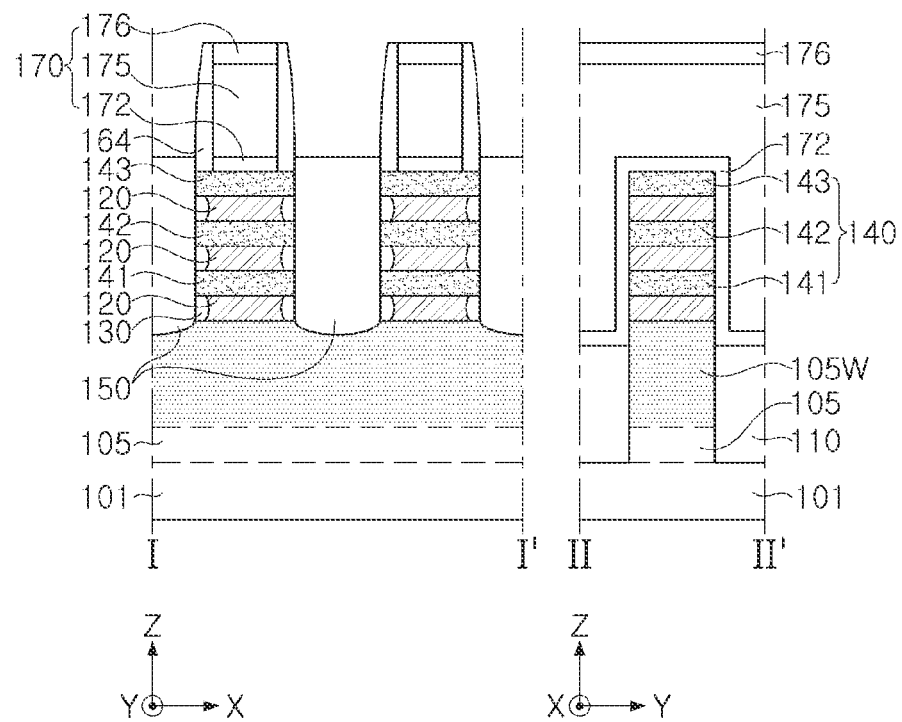
Figure 9H:
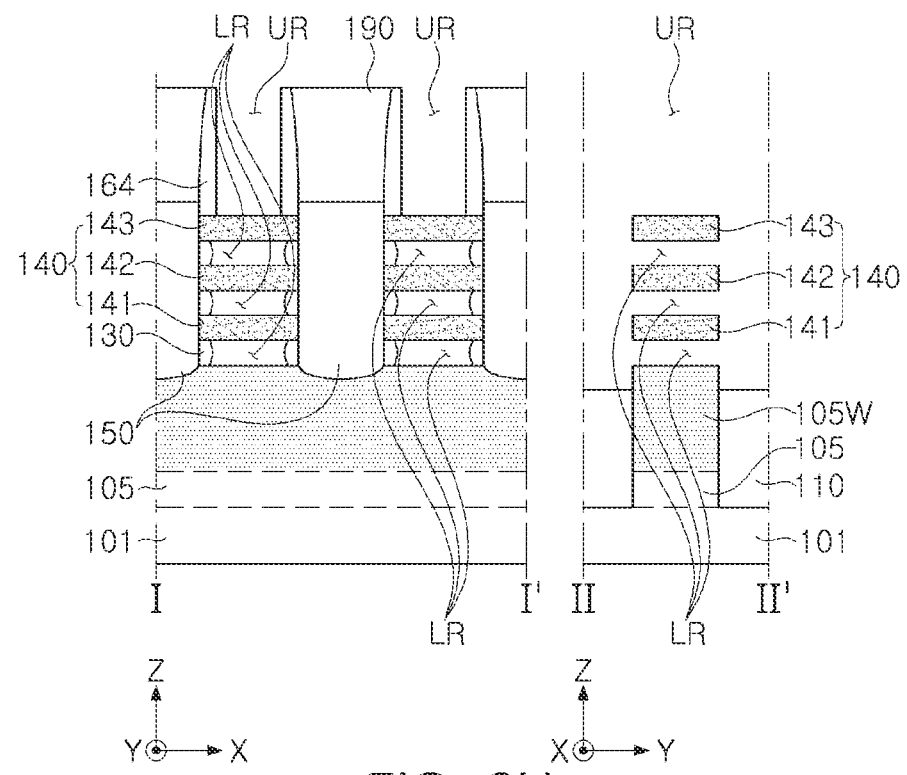
Figure 9I:
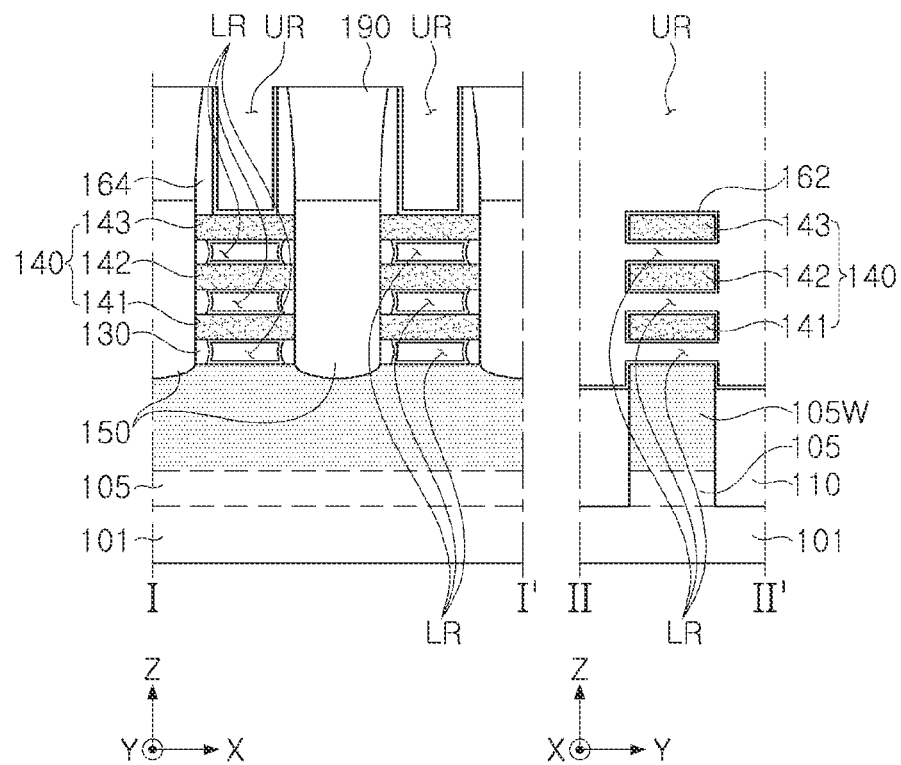
Figure 9J:
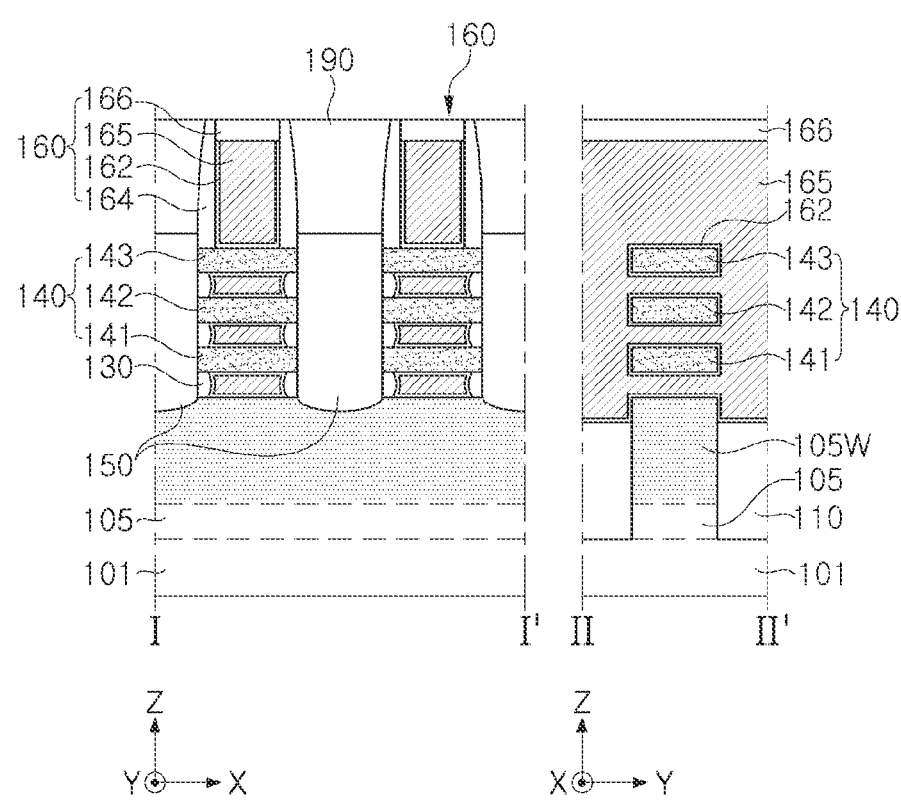

The sacrificial layers 120 may be layers that are replaced with a gate dielectric layer 162 and a gate electrode 165 through a subsequent process as illustrated in FIG. 9J. The sacrificial layers 120 may be formed of a material having etch selectivity with respect to the channel layers 141, 142, and 143. The channel layers 141, 142, and 143 may include a material different from that of the sacrificial layers 120. The sacrificial layers 120 and the channel layers 141, 142 and 143 include a semiconductor material including at least one of, for example, silicon (Si), silicon germanium (SiGe), or germanium (Ge), and the materials of the sacrificial layers 120 and the channel layers 141, 142 and 143 may be different materials. In addition, the sacrificial layers 120 and the channel layers 141, 142 and 143 may include or may not include impurities. For example, the sacrificial layers 120 may include silicon germanium (SiGe), and the channel layers 141, 142, and 143 may include silicon (Si).

The sacrificial layers 120 and the channel layers 141, 142 and 143 may be formed by performing an epitaxial growth process, by using the substrate 101 as a seed. Each of the sacrificial layers 120 and the channel layers 141, 142, and 143 may have a thickness ranging from about 1 Å to about 100 nm. The number of layers of the channel layers 141, 142, and 143 alternately stacked with the sacrificial layer 120 may be variously changed in example embodiments.

Referring to FIG. 9B, active structures may be formed by removing a portion of the substrate 101, a stack structure of the sacrificial layers 120, and the channel layers 141, 142 and 143.

The active structure may include the sacrificial layers 120 and the channel layers 141, 142, and 143 alternately stacked with each other, and may further include an active region 105 that is formed to protrude upwardly of the upper surface of the substrate 101 by removing a portion of the substrate 101. The active structures may be formed in a linear shape extending in one direction, for example, in the X direction, and may be spaced apart from each other in the Y direction.

Device isolation layers 110 may be formed in a region from which a portion of the substrate 101 has been removed, by filling an insulating material and then recessing the active region 105 to protrude. The upper surfaces of the device isolation layers 110 may be formed lower than the upper surface of the active region 105.

Referring to FIG. 9C, sacrificial gate structures 170 and gate spacer layers 164 may be formed on the active structures.

The sacrificial gate structures 170 may be sacrificial structures formed in a region in which the gate dielectric layer 162 and the gate electrode 165 are disposed on the channel structures 140 through a subsequent process, as illustrated in FIG. 9J. The sacrificial gate structure 170 may include first and second sacrificial gate layers 172 and 175 sequentially stacked, and a mask pattern layer 176. The first and second sacrificial gate layers 172 and 175 may be patterned using the mask pattern layer 176. The first and second sacrificial gate layers 172 and 175 may be an insulating layer and a conductive layer, respectively, but are not limited thereto, and the first and second sacrificial gate layers 172 and 175 may be formed as a single layer. For example, the first sacrificial gate layer 172 may include silicon oxide, and the second sacrificial gate layer 175 may include polysilicon. The mask pattern layer 176 may include silicon oxide and/or silicon nitride. The sacrificial gate structures 170 may have a linear shape extending in one direction while intersecting the active structures. The sacrificial gate structures 170 extend in the Y direction, for example, and may be spaced apart from each other in the X direction.

The gate spacer layers 164 may be formed on both sidewalls of the sacrificial gate structures 170. The gate spacer layers 164 may be formed by forming a film having a uniform thickness along the upper and side surfaces of the sacrificial gate structures 170 and the active structures, and then performing anisotropic etching process thereon. The gate spacer layers 164 may be formed of a low dielectric constant material, and may include at least one of, for example, SiO, SiN, SiCN, SiOC, SiON, or SiOCN.

Referring to FIG. 9D, between the sacrificial gate structures 170, channel structures 140 may be formed by removing the exposed sacrificial layers 120 and channel layers 141, 142 and 143 to form a recess region RC.

The exposed sacrificial layers 120 and channel layers 141, 142 and 143 may be removed by using the sacrificial gate structures 170 and the gate spacer layers 164 as masks. As a result, the channel layers 141, 142, and 143 have a limited length in the X direction and form the channel structure 140.

Referring to FIG. 9E, the exposed sacrificial layers 120 may be partially removed from the side surfaces.

The sacrificial layers 120 may be selectively etched with respect to the channel structures 140 by, for example, a wet etching process, and may be removed from a side surface in the X direction to a predetermined depth. The sacrificial layers 120 may have side surfaces that are concave inwardly by the side etching as described above. However, the shape of the side surfaces of the sacrificial layers 120 is not limited to that illustrated.

Referring to FIG. 9F, inner spacer layers 130 may be formed in a region from which the sacrificial layers 120 have been removed.

The inner spacer layers 130 may be formed by filling an insulating material in a region from which the sacrificial layers 120 are removed, and removing the insulating material deposited on the outer side of the channel structures 140. The inner spacer layers 130 may be formed of the same material as the spacer layers 164, but the material is not limited thereto. For example, the inner spacer layers 130 may include at least one of SiN, SiCN, SiOCN, SiBCN, or SiBN.

Referring to FIG. 9G, source/drain regions 150 may be formed in the recess regions RC on the active regions 105, on both sides of the sacrificial gate structures 170.

The source/drain regions 150 may be formed by performing a selective epitaxial growth process using the active regions 105 and the channel structures 140 as seeds. The source/drain regions 150 may be connected to the plurality of channel layers 141, 142 and 143 of the channel structures 140 through side surfaces thereof, and may be in contact with the spacer layers 130 between the channel layers 141, 142, and 143. The source/drain regions 150 may include impurities by in-situ doping, and may also include a plurality of layers having different doping elements and/or doping concentrations.

Thereafter, various heat treatment processes for activating impurities (or first impurities) doped in the source/drain regions 150 may be performed. Accordingly, the first impurities may diffuse into the channel layers 141, 142, and 143 and may accumulate at the interfaces between the sacrificial layers 120 and the channel layers 141, 142 and 143. In addition, when the heat treatment process is performed in a state in which the sacrificial layers 120 are not removed, second impurities (e.g., germanium (Ge)) included in the sacrificial layers 120 diffuse and may be accumulated at interfaces between the sacrificial layers 120 and the channel layers 141, 142, and 143. In addition, doped impurities (or first impurities) from the impurity region 105W in the substrate 101 may be diffused upwardly by the heat treatment process, and thus, may be accumulated at interfaces between the sacrificial layers 120 and the channel layers 141, 142, and 143. The heat treatment process may be performed after removing the sacrificial layers 120, but even in this case, the impurities doped in the source/drain regions 150 and the impurity regions 105W may be accumulated in the lower areas and the upper areas of the channel layers 141, 142 and 143.

The first impurities and the second impurities may be present in the lower and upper regions of the channel layers 141, 142, and 143 even after the sacrificial layers 120 are removed with reference to FIG. 9H below. In addition, the first impurities and the second impurities may partially diffuse into the gate dielectric layers 162 and the gate electrodes 165 after the process of forming the gate dielectric layers 162 and the gate electrodes 165 with reference to FIGS. 9I and 9J below. Accordingly, at least some regions of a gate structure 160 adjacent to the lower regions and the upper regions of the channel layers 141, 142 and 143 may include at least one of first impurities and second impurities. In this case, the first impurities and the second impurities may also have a concentration distribution concentrated in the lower and upper regions of the channel layers 141, 142 and 143, or in a region adjacent to the interface between the channel layers 141, 142 and 143 and the gate structure 160. In the case of the concentration distribution of the first impurities and the second impurities, when diffusion by the impurity region 105W is relatively dominant, the concentration distribution may have, for example, a shape as illustrated in FIGS. 4A to 4C, and when the diffusion by the source/drain regions 150 is relatively dominant, the concentration distribution may have, for example, a shape as illustrated in FIG. 4D.

Referring to FIG. 9H, the interlayer insulating layer 190 may be formed, and the sacrificial layers 120 and the sacrificial gate structures 170 may be removed.

The interlayer insulating layer 190 may be formed by forming an insulating film covering the sacrificial gate structures 170 and the source/drain regions 150 and performing a planarization process thereon.

The sacrificial layers 120 and the sacrificial gate structures 170 may be selectively removed with respect to the spacer layers 164, the interlayer insulating layer 190, and the channel structures 140. First, the sacrificial gate structures 170 are removed to form upper gap regions UR, and then the sacrificial layers 120 exposed through the upper gap regions UR are removed to form lower gap regions LR. For example, when the sacrificial layers 120 include silicon germanium (SiGe) and the channel structures 140 include silicon (Si), the sacrificial layers 120 may be selectively removed by performing a wet etching process using peracetic acid as an etchant. During the removal process, the source/drain regions 150 may be protected by the interlayer insulating layer 190 and the inner spacer layers 130.

Referring to FIG. 9I, gate dielectric layers 162 may be formed in the upper gap regions UR and the lower gap regions LR.

The gate dielectric layers 162 may conformally cover inner surfaces of the upper gap regions UR and the lower gap regions LR.

Referring to FIG. 9J, gate electrodes 165 filling the upper and lower gap regions UR and LR may be formed, and a gate capping layer 166 may be formed on the gate electrodes 165.

After forming the gate electrodes 165 to completely fill the upper and lower gap regions UR and LR, the gate electrodes 165 may be removed from the upper gap regions UR, for example, from the upper portion to a predetermined depth. The gate capping layer 166 may be formed in a region in which the gate electrodes 165 have been removed from the upper gap regions UR. Accordingly, the gate structures 160 including the gate dielectric layer 162, the gate electrode 165, the spacer layer 164, and the gate capping layer 166 may be formed.

As set forth above, according to example embodiments, a semiconductor device having improved reliability may be provided by including a plurality of 3D channels therein.

While the present inventive concept has been particularly shown and described with reference to the example embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
    an active region extending in a first direction on a substrate;
    a plurality of channel layers vertically spaced apart from each other on the active region, and including a semiconductor material;
    a gate structure extending in a second direction on the substrate,
    wherein the gate structure intersects the active region and the plurality of channel layers, and surrounds the plurality of channel layers; and
    a source/drain region disposed on the active region on at least one side of the gate structure,
    wherein the source/drain region contacts the plurality of channel layers and includes first impurities,
    wherein in a channel layer of the plurality of channel layers, a lower region adjacent to the active region includes the first impurities and second impurities at a first concentration, and an upper region includes the first impurities and the second impurities at a second concentration lower than the first concentration,
    wherein the channel layer of the plurality of channel layers is disposed between two adjacent gate layers of the gate structure.

2. The semiconductor device of claim 1, wherein a concentration of the second impurities decreases from the lower region and the upper region of the channel layer of the channel layers toward a central portion of the channel layer of the channel layers.

3. The semiconductor device of claim 1, wherein the semiconductor material comprises a first semiconductor material, and
    the second impurities comprise a second semiconductor material different from the first semiconductor material.

4. The semiconductor device of claim 3, wherein the first and second semiconductor materials include at least one of silicon (Si), silicon germanium (SiGe), or germanium (Ge).

5. The semiconductor device of claim 1, wherein the first impurities include at least one of phosphorus (P), arsenic (As), antimony (Sb), boron (B), gallium (Ga), or aluminum (Al).

6. The semiconductor device of claim 1, wherein the first concentration is a maximum value of a sum of a concentration of the first impurities and a concentration of the second impurities in the lower region of the channel layer of the channel layers, and the second concentration is a maximum value of a sum of the concentration of the first impurities and the concentration of the second impurities in the upper region of the channel layer of the channel layers.

7. The semiconductor device of claim 1, wherein at least some regions of the gate structure adjacent to the lower region and the upper region of the channel layer of the channel layers include at least one of the first impurities and the second impurities.

8. The semiconductor device of claim 1, wherein the first concentration and the second concentration have a difference of about 0.2 atomic % to about 1.5 atomic %.

9. The semiconductor device of claim 1, further comprising:
a plurality of inner spacer layers disposed on both sides of the gate structure in the first direction, on a lower surface of each of the plurality of channel layers.

10. The semiconductor device of claim 1, wherein the first impurities in the source/drain region include a first element and a second element, and
the source/drain region includes:
a plurality of first epitaxial layers, disposed below the source/drain region and on side surfaces of the plurality of channel layers in the first direction, and respectively including the first element; and
a second epitaxial layer filling areas between the plurality of first epitaxial layers and including the second element.

11. The semiconductor device of claim 10, wherein the first element includes arsenic (As), and the second element includes phosphorus (P).

12. The semiconductor device of claim 10, wherein the first impurities included in the channel layer of the channel layers include the second element.

13. The semiconductor device of claim 10, wherein the first epitaxial layers are connected to each other on a side surface of the gate structure, and protrude toward the side surface of the gate structure, on respective lower surfaces of the plurality of channel layers.

14. The semiconductor device of claim 13, wherein the first epitaxial layers surround a side surface and a lower surface of the second epitaxial layer in the first direction.

15. A semiconductor device, comprising:
an active region extending in a first direction on a substrate;
first and second channel layers vertically spaced apart from each other on the active region;
a gate structure extending in a second direction on the substrate,
wherein the gate structure intersects the active region and the first and second channel layers, and surrounds the first and second channel layers; and
a source/drain region disposed on the active region, on at least one side of the gate structure, and in contact with the first and second channel layers,
wherein the first channel layer includes impurities of a first concentration in a lower portion of the first channel layer and the impurities of a second concentration in an upper portion of the first channel layer, and
the second channel layer includes the impurities of a third concentration in a lower portion of the second channel layer and the impurities of a fourth concentration in an upper portion of the second channel layer,
wherein the first to fourth concentrations are sequentially lowered.

16. The semiconductor device of claim 15, wherein the impurities include a semiconductor element and a doping element.

17. The semiconductor device of claim 16, wherein the semiconductor element includes germanium (Ge), and
the doping element includes at least one of phosphorus (P), arsenic (As), antimony (Sb), boron (B), gallium (Ga), or aluminum (Al).

18. A semiconductor device, comprising:
an active region extending in a first direction on a substrate;
a plurality of channel layers vertically spaced apart from each other on the active region, and including a semiconductor material;
a gate structure extending in a second direction on the substrate,
wherein the gate structure intersects the active region and the plurality of channel layers, and surrounds the plurality of channel layers; and
a source/drain region disposed on the active region on at least one side of the gate structure,
wherein the source/drain region contacts the plurality of channel layers and includes first impurities,
wherein in at least a portion of the plurality of channel layers, a lower region adjacent to the active region includes the first impurities and second impurities at a first concentration, and an upper region includes the first impurities and the second impurities at a second concentration lower than the first concentration,
wherein the first impurities in the source/drain region include a first element and a second element, and
the source/drain region includes:
a plurality of first epitaxial layers, disposed below the source/drain region and on side surfaces of the plurality of channel layers in the first direction, and respectively including the first element; and
a second epitaxial layer filling areas between the plurality of first epitaxial layers and including the second element.

19. The semiconductor device of claim 18, wherein the first element includes arsenic (As), and the second element includes phosphorus (P).

20. The semiconductor device of claim 18, wherein the first impurities included in the at least a portion of the channel layers include the second element.

* * * * *